United States Patent
Song et al.

(10) Patent No.: US 12,518,985 B2
(45) Date of Patent: Jan. 6, 2026

(54) WAFER HEATING APPARATUS AND WAFER PROCESSING APPARATUS USING THE SAME

(71) Applicant: SEMES CO., LTD., Cheonan-si (KR)

(72) Inventors: Soo Han Song, Goyang-si (KR); Jung Bong Choi, Suwon-si (KR); Kang Seop Yun, Cheonan-si (KR); Young Il Lee, Cheonan-si (KR); Min Ok Kang, Daejeon (KR)

(73) Assignee: SEMES CO., LTD., Cheonan-si (KR)

( * ) Notice: Subject to any disclaimer, the term of this patent is extended or adjusted under 35 U.S.C. 154(b) by 372 days.

(21) Appl. No.: 18/126,933

(22) Filed: Mar. 27, 2023

(65) Prior Publication Data
US 2024/0096663 A1    Mar. 21, 2024

(30) Foreign Application Priority Data

Sep. 16, 2022  (KR) .................. 10-2022-0116952

(51) Int. Cl.
*H01L 21/67*    (2006.01)

(52) U.S. Cl.
CPC .... *H01L 21/67115* (2013.01); *H01L 21/6708* (2013.01)

(58) Field of Classification Search
None
See application file for complete search history.

(56) References Cited

U.S. PATENT DOCUMENTS

| | | | | |
|---|---|---|---|---|
| 6,121,579 A | * | 9/2000 | Aoki | C23C 16/481 219/390 |
| 7,311,782 B2 | * | 12/2007 | Strang | H01L 21/68757 118/724 |
| 7,678,197 B2 | * | 3/2010 | Maki | H01L 21/6831 118/724 |
| 9,948,214 B2 | * | 4/2018 | Lubomirsky | H01L 21/67103 |
| 2015/0357222 A1 | * | 12/2015 | Miyashita | H01L 21/67115 361/234 |
| 2016/0013079 A1 | * | 1/2016 | Choi | H01L 21/67051 156/345.21 |

(Continued)

FOREIGN PATENT DOCUMENTS

| | | |
|---|---|---|
| JP | 11-283729 | 10/1999 |
| JP | 2022-081442 | 5/2022 |

(Continued)

OTHER PUBLICATIONS

Office Action from the Japan Patent Office dated Aug. 8, 2023.
Office Action from the Korean Intellectual Property Office dated May 27, 2024.

*Primary Examiner* — Sylvia MacArthur

(57) ABSTRACT

Proposed are a wafer heating apparatus and a wafer processing apparatus using the same. More particularly, proposed are a wafer heating apparatus having an improved structure to enable efficient cooling of a terminal block, and a wafer processing apparatus using the same. A wafer heating apparatus for heating a wafer according to one embodiment includes a heater disposed below the wafer and configured to serve as a heat source, a cooling plate disposed below the heater and configured to provide cool air, and a terminal block configured to supply power to the heater and having a lower end portion in contact with the cooling plate.

16 Claims, 5 Drawing Sheets

(56) References Cited

U.S. PATENT DOCUMENTS

2021/0050235 A1    2/2021  Yun et al.
2022/0157645 A1    5/2022  Song et al.
2024/0096663 A1*   3/2024  Song .................. H01L 21/6708

FOREIGN PATENT DOCUMENTS

| KR | 10-0902633        |   | 6/2009 |
|----|-------------------|---|--------|
| KR | 10-2010-0028752   |   | 3/2010 |
| KR | 10-2012-0067042   |   | 6/2012 |
| KR | 20150066289 A     | * | 6/2013 |
| KR | 10-2019-0007586   |   | 1/2019 |
| KR | 10-2021-0021185   |   | 2/2021 |

* cited by examiner

WAFER HEATING APPARATUS AND WAFER PROCESSING APPARATUS USING THE SAME

CROSS REFERENCE TO RELATED APPLICATION

The present application claims priority to Korean Patent Application No. 10-2022-0116952, filed Sep. 16, 2022, the entire contents of which is incorporated by reference herein for all purposes.

BACKGROUND OF THE INVENTION

Field of the Invention

The present disclosure relates to a wafer heating apparatus and a wafer processing apparatus using the same. More particularly, the present disclosure relates to a wafer heating apparatus having an improved structure to enable efficient cooling of a terminal block, and to a wafer processing apparatus using the same.

Description of the Related Art

Semiconductor devices are manufactured by repeatedly sequentially stacking thin films to form a predetermined pattern on a silicon wafer. The formation and stacking of thin films are achieved by repeating a number of unit processes such as a deposition process, a photo process, an etching process, etc. Semiconductor device manufacturing equipment that performs such unit processes is largely classified into a batch type that processes a predetermined unit number of wafers in batches and a single wafer type that sequentially processes each single wafer individually. As an example of the single-wafer type equipment, there is equipment that supplies a processing liquid to an upper surface of a wafer while rotating the wafer in a state supported by a spin chuck. In the case of this single-wafer type equipment, processing of the wafer is achieved in such a manner that the wafer mounted on the spin chuck is rotated as rotational force generated from a driving source is transmitted to the spin chuck by a rotary shaft connected to a lower part of the spin chuck, and then a chemical liquid such as photoresist, developer, or cleaning liquid is sprayed by a wafer processing apparatus from above the rotating wafer.

Meanwhile, conventionally, in order to improve processing efficiency, there are some cases in which the wafer is processed while being heated in equipment for liquid processing of wafers.

As illustrated in FIG. 1, a wafer heating apparatus for heating a wafer according to the related art may include a lamp heater 1 serving as a heat source, a reflector 3, and a cooling plate 4. The lamp heater 1 receives power from a terminal block 2. Since it is necessary to cool the wafer after processing is completed, the wafer is cooled by the cooling plate 4.

The terminal block 2 may be overheated and its lifespan may be shortened since it is disposed on the reflector 3 in a high-temperature state, so appropriate cooling of the terminal block 2 is required. However, cooling of the terminal block 2 is hindered by the heated reflector 3 disposed on the cooling plate 4.

The foregoing is intended merely to aid in the understanding of the background of the present disclosure, and is not intended to mean that the present disclosure falls within the purview of the related art that is already known to those skilled in the art.

SUMMARY OF THE INVENTION

Accordingly, the present disclosure has been made keeping in mind the above problems occurring in the related art, and the present disclosure provides a wafer heating apparatus having an improved structure to enable efficient cooling of a terminal block exposed to a high-temperature environment, and to provide a wafer processing apparatus using the same.

In order to achieve the above objective, according to one aspect of the present disclosure, there is provided a wafer heating apparatus for heating a wafer, the wafer heating apparatus including: a heater disposed below the wafer and configured to serve as a heat source; a cooling plate disposed below the heater and configured to provide cool air; and a terminal block configured to supply power to the heater and having a lower end portion in contact with the cooling plate.

The wafer heating apparatus may further include a reflector disposed between the heater and the cooling plate and configured to reflect heat emitted from the heater toward the wafer.

The reflector may have an opening so that the lower end portion of the terminal block is in contact with the cooling plate through the opening.

The opening may have a shape conforming to a sectional shape of the terminal block.

The cooling plate may have a recess depressed downward so that a power cable connected to the terminal block is cooled by the cooling plate while being received in the recess.

A width of the recess may be smaller than a width of the opening.

The heater may include a plurality of concentric IR lamp heaters, and the lamp heaters may be disposed on the same plane.

A flow path for flow of cooling water may be disposed in the cooling plate.

According to another aspect of the present disclosure, there is provided a wafer processing apparatus including: a chamber configured to provide a processing area; a wafer support unit installed in the processing area of the chamber and configured to support a wafer; a chemical liquid supply unit configured to supply a chemical liquid to the wafer supported by the wafer support unit; and a wafer heating unit configured to heat the wafer. The wafer heating unit may include: a heater disposed below the wafer and configured to serve as a heat source; a cooling plate disposed below the heater and configured to provide cool air; and a terminal block configured to supply power to the heater and having a lower end portion in contact with the cooling plate.

According to another aspect of the present disclosure, there is provided a wafer etching apparatus for etching a surface of a wafer, the wafer etching apparatus including: a chamber configured to provide a processing area; a wafer support unit installed in the processing area and configured to support the wafer, the wafer support unit including a spin chuck and a rotation actuator configured to rotate the spin chuck; an etching liquid supply unit configured to supply an etching liquid to the wafer supported by the wafer support unit, the etching liquid supply unit including a nozzle configured to spray the etching liquid onto the wafer, a nozzle actuator configured to move the nozzle, and an etching liquid heater configured to heat the etching liquid; a recovery unit provided in a shape surrounding the wafer support unit, and configured to recover reaction by-products, which result from reactions between the etching liquid sprayed onto the surface of the wafer by the etching liquid supply unit and the surface of the wafer, or the etching liquid scattered from the wafer; and a wafer heating unit disposed below the spin chuck and configured to heat the wafer. The wafer heating unit may include: a heater disposed below the wafer support unit, configured to serve as a heat source, and configured as a plurality of concentric IR lamp heaters disposed on the same plane; a cooling plate disposed below the heater, configured to provide cool air, and having a flow path disposed therein for flow cooling water; a terminal block configured to supply power to the heater and having a lower end portion in contact with the cooling plate; and a reflector disposed between the heater and the cooling plate and configured to reflect heat emitted from the heater toward the wafer. The reflector may have an opening having a shape conforming to a sectional shape of the terminal block so that the lower end portion of the terminal block is in contact with the cooling plate through the opening, and the cooling plate may have a recess depressed downward at a position below the opening and having a width smaller than a width of the opening so that a power cable connected to the terminal block is cooled by the cooling plate while being received in the recess.

According to the present disclosure, it is possible to provide a wafer heating apparatus having an improved structure to enable efficient cooling of a terminal block exposed to a high-temperature environment, and to provide a wafer processing apparatus using the same.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, exemplary embodiments of the present disclosure will be described with reference to the drawings to provide specific contents for practicing the present disclosure.

First, a wafer heating apparatus, which is a first aspect of the present disclosure, will be described.

Figure 1:
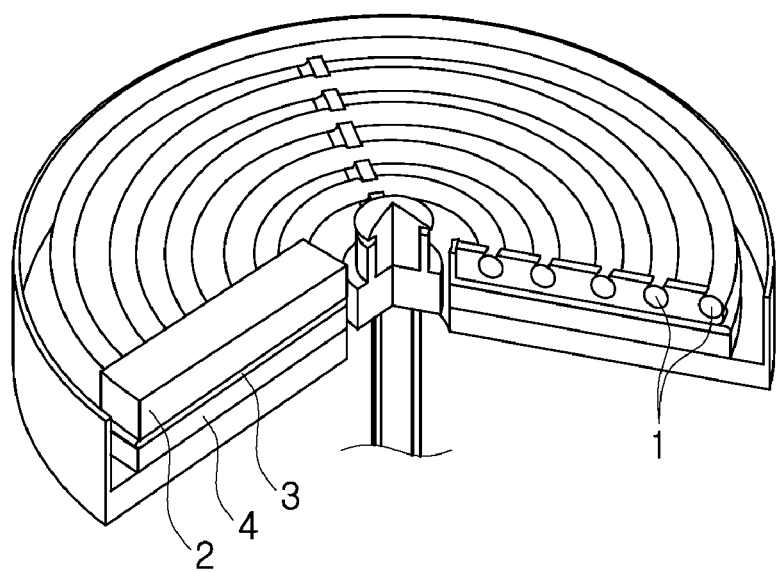
FIG. 1 is a sectional view illustrating a wafer heating apparatus according to the related art.
Figure 2:
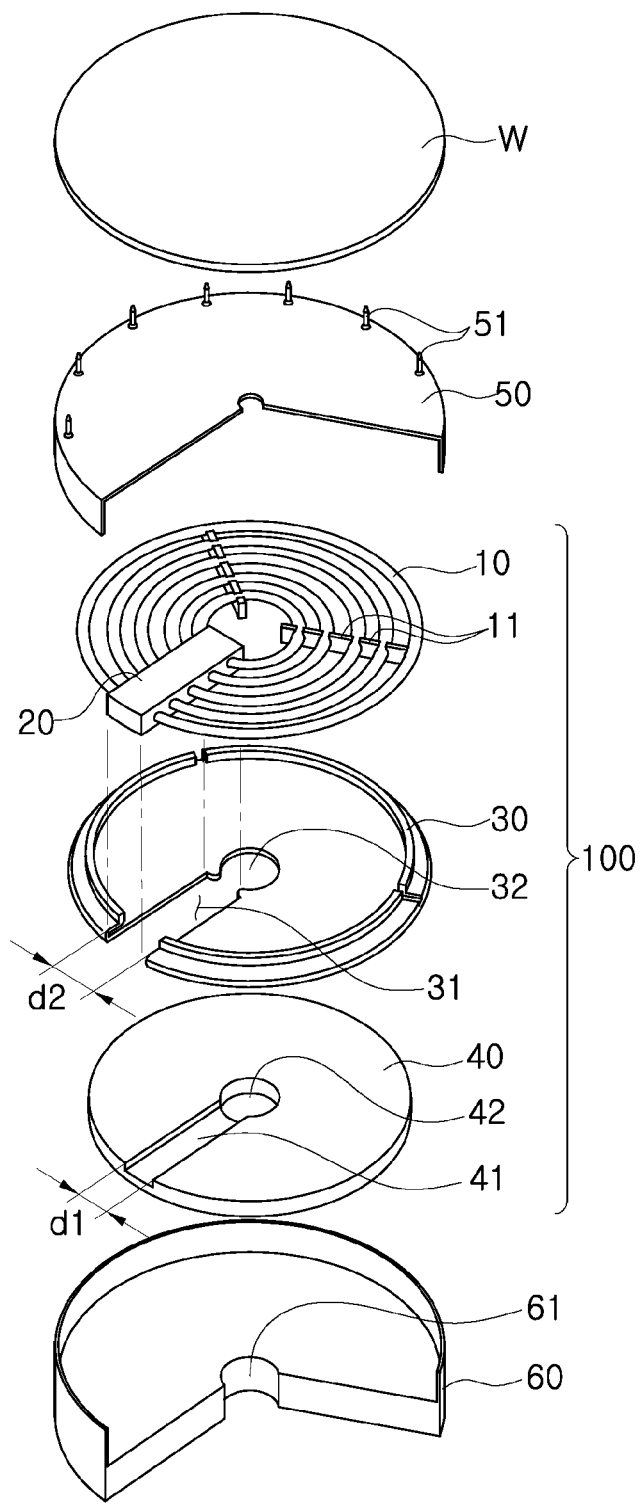
FIG. 2 is an exploded perspective illustrating a wafer heating apparatus according to an embodiment of the present disclosure.
Figure 3:
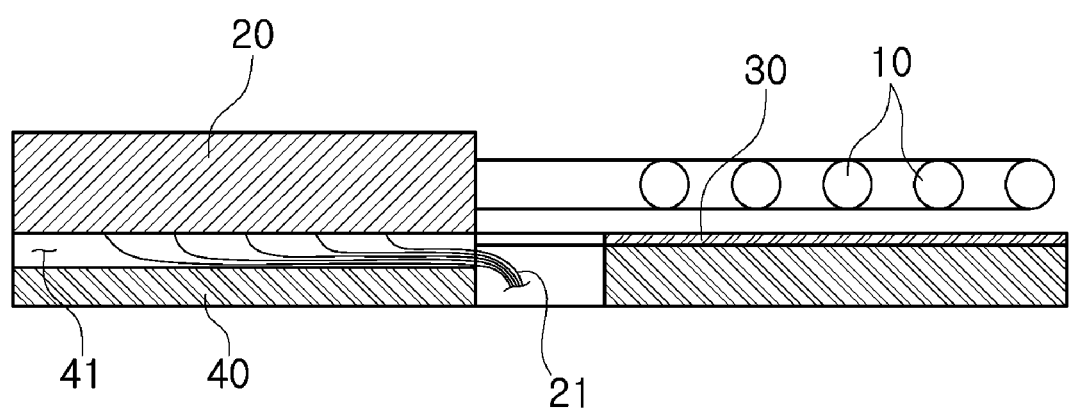
FIG. 3 is a coupling sectional view illustrating the wafer heating apparatus illustrated in FIG. 2.

FIG. 2 is an exploded perspective illustrating a wafer heating unit 100 according to an embodiment of the present disclosure. FIG. 3 is a coupling sectional view illustrating the wafer heating unit 100 illustrated in FIG. 2.

The wafer heating unit 100 according to the present embodiment is an apparatus for heating a wafer W by being installed in a wafer processing apparatus for processing such as etching or cleaning. The wafer heating unit 100 includes a heater 10, a terminal block 20, a reflector 30, and a cooling plate 40.

The heater 10 is a heat source disposed below the wafer W to heat the wafer W. The wafer W is supported by a spin chuck 50. A plurality of chuck pins 51 supporting the wafer W in contact therewith are installed on the spin chuck 50.

As illustrated in FIG. 2, the heater 10 may be configured as a plurality of concentric IR lamp heaters. Each of the IR lamp heaters includes a hollow casing and a filament (not illustrated) installed inside the casing. Opposite ends of the casing are connected to the terminal block 20 to receive power for heat generation.

The IR lamp heaters are disposed on the same plane. The fact that the IR lamp heaters are disposed on the same plane means that the distances between each of the IR lamp heaters and the wafer W are the same since the installation heights of the IR lamp heaters are the same. During processing of the wafer W, when the wafer W is not uniformly heated, processing uniformity of the wafer W may decrease. In view of this, by disposing the IR lamp heaters on the same plane, the IR lamp heaters have the same distance from the wafer W, thereby ensuring that the wafer W can be uniformly heated. A support means 11 for supporting the IR lamp heaters, which are the heater 10, is provided between the IR lamp heaters so that the IR lamp heaters are prevented from sagging due to gravity and thus are maintained in a state of being disposed on the same plane.

The terminal block 20 receives power from a power source and supplies the power to the heater 10. The terminal block 20 is connected to a power cable 21 for power supply. The terminal block 20 may be made of a ceramic material.

The reflector 30 is disposed below the heater 10 to efficiently heat the wafer W. The reflector 30 reflects heat emitted from the IR lamp heaters, which are the heater 10, toward the wafer W. In addition, the reflector 30 allows the wafer W to be heated uniformly.

The reflector 30 may be made of an opaque material to prevent transmission of radiant heat emitted from the heater 10.

As illustrated in FIG. 2, the reflector 30 has an opening 31 having a shape conforming to the sectional shape of the terminal block 20. The shape conforming to the sectional shape of the terminal block means that when the terminal block 20 is disposed through the opening 31, the remaining space of the opening 31 except for the space for the terminal block 20 is as small as manufacturing tolerance. By configuring the opening 31 to have a shape conforming to the sectional shape of the terminal block 20, the area of the reflector 30 is maximized so that the heat emitted from the heater 10 is reflected as much as possible.

The cooling plate 40 is disposed below the reflector 30 and cools the wafers down. A flow path (not illustrated) for flow of cooling water is disposed in the cooling plate 40. As the cooling water flows along the flow path (not illustrated) disposed in the cooling plate 40, the cooling water absorbs heat and discharge it to the outside.

The cooling plate 40 is disposed on a lower chuck 60 to cool the wafer W, the terminal block 20, and the lower chuck 60, and is supported by the lower chuck 60.

The terminal block 20 has a lower end portion in direct contact with the cooling plate 40 through the opening 31. By configuring the terminal block 20 to be in direct contact with the cooling plate 40, cooling efficiency for the terminal block 20 is increased so that the terminal block 20 is prevented from being overheated and damaged in the process of heating the wafer W by the heater 10.

As illustrated in FIG. 3, the cooling plate 40 has a recess 41 depressed downward at a position below the opening 31, and a through-hole 42 formed in the center thereof. The power cable 21 connected to the terminal block 20 is received in the recess 41 and passes through the through-hole 42. The power cable 21 is cooled by the cooling plate while being received in the recess 41 so that cooling efficiency for the power cable 21 is increased.

Like the terminal block 20, the power cable 21 connected to the terminal block 20 may also be heated by the heater 10 and a shortened lifespan or reduced efficiency may be resulted. In view of this, by allowing the power cable 21 to be cooled while being received in the recess 41, a problem that may be caused by heating of the power cable 21 is solved.

The power cable 21 is cooled by the cooling plate 40 by direct contact with the cooling plate 40 in the recess 41.

Meanwhile, a width d1 of the recess 41 may be smaller than a width d2 of the opening 31 so that the terminal block 20 is supported by the cooling plate 40.

Like the cooling plate 40, the reflector 30 and the lower chuck 60 have through-holes 32 and 61, respectively. These through-holes 32 and 61 provide spaces for installation of a spindle (not illustrated), which is a rotary shaft of a rotation actuator (not illustrated) for rotating the spin chuck 50.

Next, a wafer processing apparatus, which is a second aspect of the present disclosure will be described.

Figure 4:
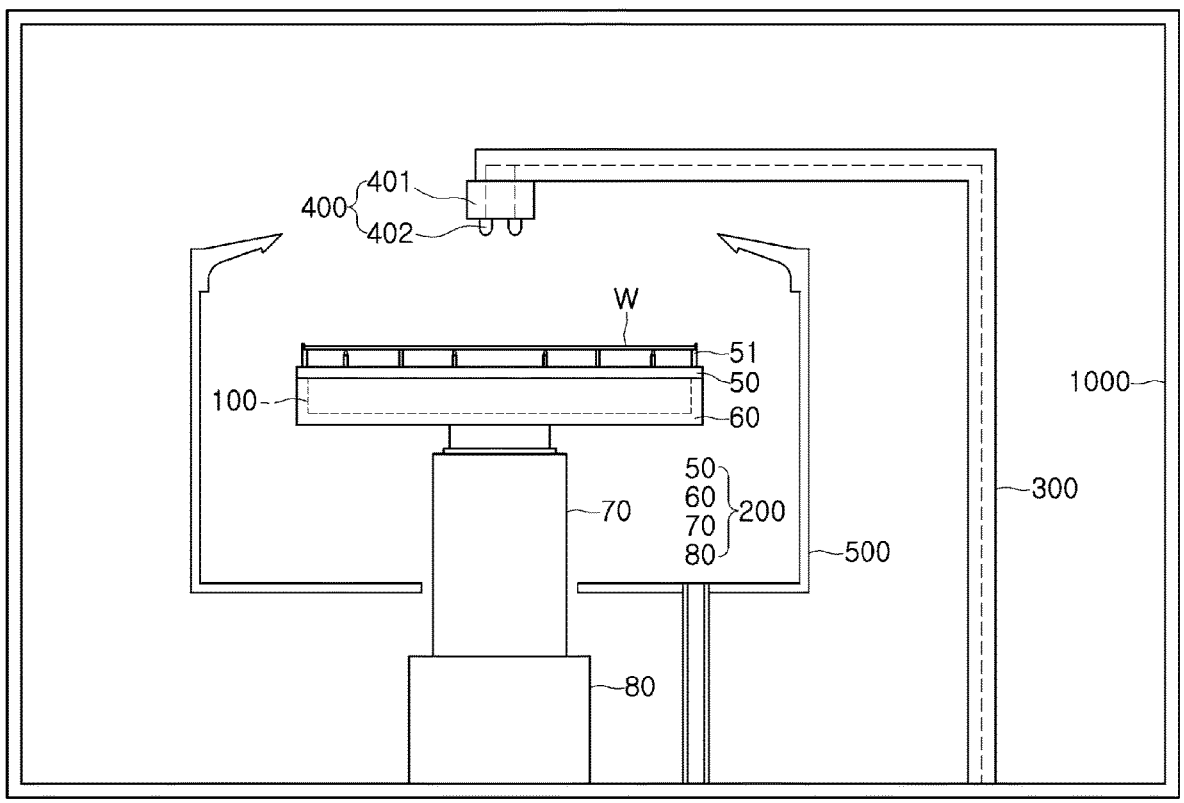
FIG. 4 is a view illustrating a wafer processing apparatus according to an embodiment of the present disclosure.

FIG. 4 is a view illustrating a wafer processing apparatus according to an embodiment of the present disclosure.

The wafer processing apparatus according to the present embodiment includes a chamber 1000, a wafer support unit 200, a chemical liquid supply unit 300, and a wafer heating unit 100. The wafer processing apparatus according to the present embodiment may be various types of apparatuses that perform processing while heating a wafer, such as a cleaning apparatus for cleaning a wafer or an etching apparatus.

The chamber 1000 provides a processing area for processing a wafer W.

The wafer support unit 200 is installed in the processing area provided by the chamber 1000 and supports the wafer W. The wafer support unit 200 includes a spin chuck 50, a lower chuck 60, a spindle 70, and a rotation actuator 80. A plurality of chuck pins 51 are installed on the spin chuck 50.

A recovery unit 500 is provided around the wafer support unit 200 to recover processing by-products, which result from processing of the wafer W by spraying a chemical liquid onto the surface of the wafer W, or the chemical liquid scattered from the wafer W.

The chemical liquid supply unit 300 supplies a chemical liquid for processing the wafer W, and may include a pipe, a valve, a pump, and the like. For the chemical liquid supply unit 300, a known configuration may be adopted and thus a detailed description thereof is omitted. The dotted line in the drawing indicates movement of the chemical liquid. The chemical liquid may be a cleaning liquid for cleaning the wafer W or an etching liquid for etching the wafer W.

The chemical liquid supply unit 300 may include a spray unit 400. The spray unit 400 is connected to the chemical liquid supply unit 300 to spray the chemical liquid received from the chemical liquid supply unit 300 onto the wafer W. The spray unit 400 may include a nozzle head 401 and a nozzle 402. The spray unit 400 sprays the chemical liquid onto the wafer W through the nozzle 402.

The wafer heating unit 100 heats the wafer W. The wafer heating unit 100 includes a heater 10, a terminal block 20, a reflector 30, and a cooling plate 40 (see FIGS. 2 and 3).

Since the wafer heating unit 100 according to the present embodiment remains substantially the same as that of the above-described wafer heating apparatus, an additional description thereof is omitted.

Hereinafter, a wafer etching apparatus, which is a third aspect of the present disclosure, will be described with reference to the drawings.

Figure 5:
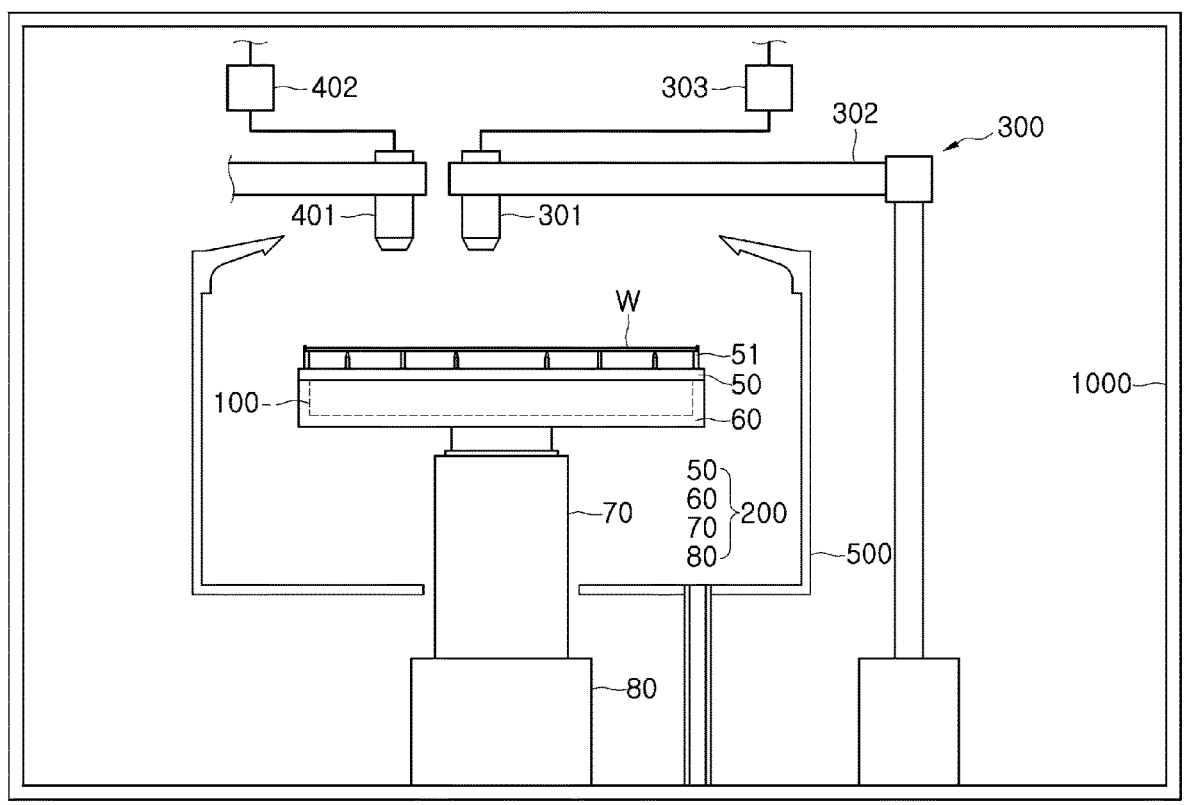
FIG. 5 is a view illustrating a wafer etching apparatus according to an embodiment of the present disclosure.

FIG. 5 is a view illustrating a wafer etching apparatus according to an embodiment of the present disclosure.

The wafer etching apparatus according to the present embodiment is an apparatus for etching a surface of a wafer W. The wafer etching apparatus includes a chamber 1000, a wafer support unit 200, an etching liquid supply unit 300, a recovery unit 500, and a wafer heating unit 100.

The chamber 1000 provides a processing area for etching processing.

The wafer support unit 200 is installed in the processing area provided by the chamber 1000 to support the wafer W. The wafer support unit 200 includes a spin chuck 50, a lower chuck 60, a spindle 70, and a rotation actuator 80. A plurality of chuck pins 51 are installed on the spin chuck 50.

The etching liquid supply unit 300 supplies an etching liquid to the wafer W supported by the wafer support unit 200. The etching liquid supply unit 300 includes a nozzle 301, a nozzle actuator 302, and an etching liquid heater 303. As the etching liquid, phosphoric acid ($H_3PO_4$) may be used. A silicon oxide layer or a silicon nitride layer on the surface of the wafer W may be etched by the phosphoric acid.

The nozzle 301 directly sprays the etching liquid onto the wafer W.

The nozzle actuator 302 moves the nozzle 301. When the nozzle 301 sprays the etching liquid onto the wafer W, the nozzle actuator 302 drives the nozzle 301 to be positioned above the center of the wafer W, and after spraying of the etching liquid is completed, the nozzle actuator 302 drives the nozzle 301 to be spaced from the wafer W.

The etching liquid heater 303 heats the etching liquid. Etching by the etching liquid is performed by a chemical reaction. The reason why the etching liquid is heated is that the rate of the chemical reaction increases with a rise in the temperature of the etching liquid. The etching liquid heater 303 may heat the etching liquid to a temperature equal to or less than the boiling point of the etching liquid, for example, 150° C.

Meanwhile, a deionized water supply unit 400 may be provided to supply deionized water (DIW) to the wafer W together with the etching liquid for an etching reaction. The deionized water supply unit 400 may include a deionized water nozzle 401, a deionized water nozzle actuator (not illustrated), and a deionized water heater 402.

The deionized water nozzle 401 sprays deionized water onto the wafer W. The deionized water nozzle actuator (not illustrated) drives the deionized water nozzle 401. The deionized water heater 402 heats deionized water to increase the etching reaction rate. A driving mechanism of the deionized water nozzle actuator (not illustrated) may be substantially the same as that of the nozzle actuator 302.

The recovery unit 500 recovers reaction by-products, which result from reactions between the etching liquid or deionized water sprayed onto the surface of the wafer W by the etching liquid supply unit 300 and the surface of the wafer W, or the etching liquid or deionized water scattered from the wafer W. As illustrated in FIG. 5, the recovery unit 500 is disposed to surround the wafer support unit 200 and the wafer W.

The wafer heating unit 100 is disposed below the spin chuck 50 to heat the wafer W. The wafer heating unit 100 includes a heater 10, a terminal block 20, a reflector 30, and a cooling plate 40 (see FIGS. 2 and 3). Since the wafer heating unit 100 according to the present embodiment remains substantially the same as that of the above-described wafer heating apparatus, an additional description thereof is omitted.

While specific contents for practicing the present disclosure have been provided by describing some aspects of the present disclosure and embodiments according to the aspects, the spirit and scope of the present disclosure are not limited to the embodiments and various changes and modifications are possible without departing from the spirit and scope of the present disclosure.

What is claimed is:

1. A wafer heating apparatus for heating a wafer, the wafer heating apparatus comprising:
    a heater disposed below the wafer and configured to heat the wafer;
    a cooling plate disposed below the heater and configured to cool the wafer down;
    a terminal block configured to supply power to the heater and having a lower end portion in contact with the cooling plate; and
    a reflector disposed between the heater and the cooling plate and configured to reflect heat emitted from the heater toward the wafer,
    wherein the reflector has an opening so that the lower end portion of the terminal block is in contact with the cooling plate through the opening.

2. The wafer heating apparatus of claim 1,
    wherein the opening has a shape conforming to a sectional shape of the terminal block.

3. The wafer heating apparatus of claim 1,
    wherein the cooling plate has a recess depressed downward so that a power cable connected to the terminal block is cooled by the cooling plate while being received in the recess.

4. The wafer heating apparatus of claim 1,
    wherein the cooling plate has a recess recessed downward at a position below the opening so that a power cable connected to the terminal block is cooled by the cooling plate while being received in the recess.

5. The wafer heating apparatus of claim 4,
    wherein a width of the recess is smaller than a width of the opening.

6. The wafer heating apparatus of claim 1,
    wherein the heater comprises a plurality of concentric IR lamp heaters, and
    the lamp heaters are disposed on the same plane.

7. The wafer heating apparatus of claim 1,
    wherein a flow path for flow of cooling water is disposed in the cooling plate.

8. A wafer processing apparatus comprising:
    a chamber configured to provide a processing area;
    a wafer support unit installed in the processing area of the chamber and configured to support a wafer;
    a chemical liquid supply unit configured to supply a chemical liquid to the wafer supported by the wafer support unit; and
    a wafer heating unit configured to heat the wafer,
    wherein the wafer heating unit comprises:
    a heater disposed below the wafer and configured to serve as a heat source;
    a cooling plate disposed below the heater and configured to provide cool air;
    a terminal block configured to supply power to the heater and having a lower end portion in contact with the cooling plate; and
    a reflector disposed between the heater and the cooling plate and configured to reflect heat emitted from the heater toward the wafer,
    wherein the reflector has an opening so that the lower end portion of the terminal block is in contact with the cooling plate through the opening.

9. The wafer processing apparatus of claim 8,
    wherein the opening has a shape conforming to a sectional shape of the terminal block.

10. The wafer processing apparatus of claim 8,
    wherein the cooling plate has a recess depressed downward so that a power cable connected to the terminal block is cooled by the cooling plate while being received in the recess.

11. The wafer processing apparatus claim 8,
    wherein the cooling plate has a recess depressed downward at a position below the opening so that a power cable connected to the terminal block is cooled by the cooling plate while being received in the recess.

12. The wafer processing apparatus of claim 11, wherein a width of the recess is smaller than a width of the opening.

13. The wafer processing apparatus of claim 12,
    wherein the heater comprises a plurality of concentric infrared (IR) lamp heaters, and
    the plurality of concentric IR lamp heaters are disposed on the same plane.

14. The wafer processing apparatus of claim 8,
    wherein a flow path for flow of cooling water is disposed in the cooling plate.

15. The wafer processing apparatus of claim 8,
    wherein the wafer support unit comprises: a spin chuck; and a rotation actuator disposed below the spin chuck and configured to rotate the spin chuck.

16. A wafer etching apparatus for etching a surface of a wafer, the wafer etching apparatus comprising:
    a chamber configured to provide a processing area;
    a wafer support unit installed in the processing area and configured to support the wafer, the wafer support unit comprising a spin chuck and a rotation actuator configured to rotate the spin chuck;
    an etching liquid supply unit configured to supply an etching liquid to the wafer supported by the wafer support unit, the etching liquid supply unit comprising a nozzle configured to spray the etching liquid onto the wafer, a nozzle actuator configured to move the nozzle, and an etching liquid heater configured to heat the etching liquid;
    a recovery unit provided in a shape surrounding the wafer support unit, and configured to recover reaction by-products, which result from reactions between the etching liquid sprayed onto the surface of the wafer by the etching liquid supply unit and the surface of the wafer, or the etching liquid scattered from the wafer; and
    a wafer heating unit disposed below the spin chuck and configured to heat the wafer,
    wherein the wafer heating unit comprises:
    a heater disposed below the wafer support unit, configured to serve as a heat source, and configured as a plurality of concentric IR lamp heaters disposed on the same plane;
    a cooling plate disposed below the heater, configured to provide cool air, and having a flow path disposed therein for flow cooling water;

a terminal block configured to supply power to the heater and having a lower end portion in contact with the cooling plate; and a reflector disposed between the heater and the cooling plate and configured to reflect heat emitted from the heater toward the wafer, wherein the reflector has an opening having a shape conforming to a sectional shape of the terminal block so that the lower end portion of the terminal block is in contact with the cooling plate through the opening, and the cooling plate has a recess depressed downward at a position below the opening and having a width smaller than a width of the opening so that a power cable connected to the terminal block is cooled by the cooling plate while being received in the recess.

\* \* \* \* \*